United States Patent

Legrady et al.

[11] Patent Number: 5,816,868
[45] Date of Patent: Oct. 6, 1998

[54] CAPILLARY ACTION PROMOTING SURFACE MOUNT CONNECTORS

[75] Inventors: Janos Legrady, Putnam Valley; Ronald M. Fredriks, Pine Plains, both of N.Y.

[73] Assignee: Zierick Manufacturing Corp., Mt. Kisco, N.Y.

[21] Appl. No.: 600,112

[22] Filed: Feb. 12, 1996

[51] Int. Cl.⁶ .................................................. H01R 4/02
[52] U.S. Cl. .................. 439/876; 439/940; 228/258; 228/215
[58] Field of Search ...................... 439/876, 891, 439/83; 228/258, 215

[56] References Cited

U.S. PATENT DOCUMENTS

| | | | |
|---|---|---|---|
| 1,915,185 | 6/1933 | Gagnon | 439/891 |
| 3,428,934 | 2/1969 | Reider, Jr. et al. | 439/876 |
| 4,017,142 | 4/1977 | Clark et al. | 439/876 |
| 4,641,426 | 2/1987 | Hartman et al. | 439/876 |
| 4,678,250 | 7/1987 | Romine et al. | 439/83 |
| 4,884,335 | 12/1989 | McCoy et al. | 439/876 |
| 5,451,174 | 9/1995 | Bogursky et al. | 439/876 |

*Primary Examiner*—Neil Abrams
*Assistant Examiner*—T C Patel
*Attorney, Agent, or Firm*—Lackenbach Siegel Marzullo Aronson & Greenspan, PC

[57] ABSTRACT

One and two piece surface mount pin constructions include excess solder receiving channels. In the one piece construction an elongate channel is provided through a tubular pin which is flared or swaged at the lower end to form a base. In the two piece construction a solid pin is provided at a lower end with a uniform cross section in the form of a regular polygon, such as a square, hexagon or octagon. The resulting edges are press-fit against an internal surface of a sleeve which is also swaged at a lower end to form a base. The spaces between the sleeve and the flat or convex surfaces on the captured end of the pin provide the solder-receiving channels. A bead or shoulder on the pins can provide a stop for a vacuum nozzle. When a flared upper lip is used for this purpose it can also serve as a reservoir or well to receive excess solder beyond the amount that can be received in the channels.

20 Claims, 4 Drawing Sheets

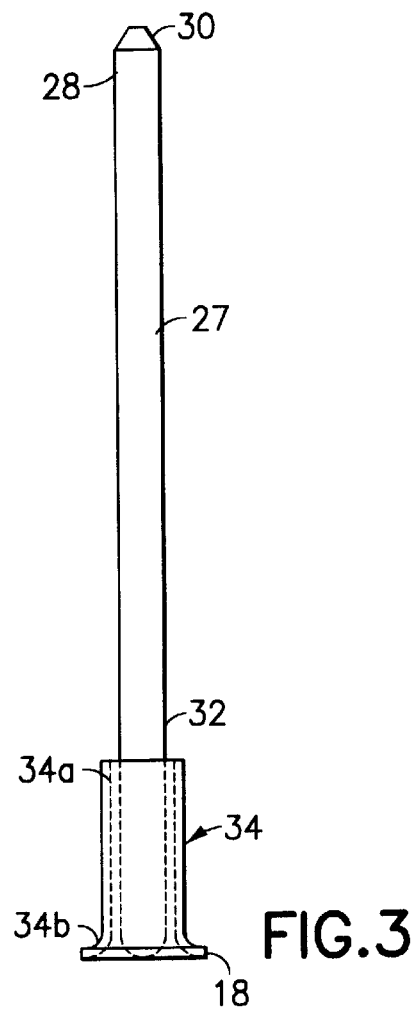
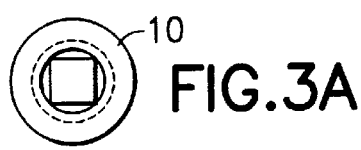
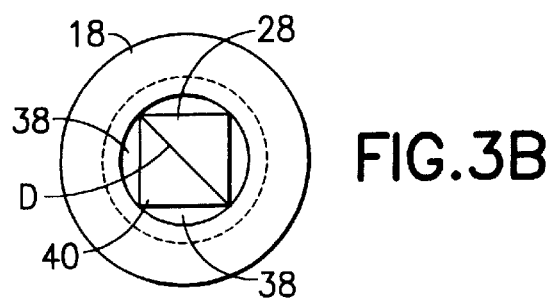
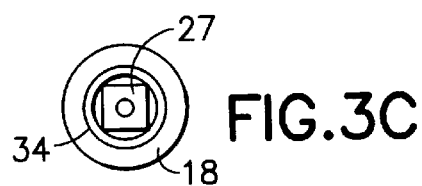

CAPILLARY ACTION PROMOTING SURFACE MOUNT CONNECTORS

BACKGROUND OF THE INVENTION

1. Field of the Invention

This invention generally relates to surface mount connectors for printed circuit boards and, more specifically, capillary action promoting surface mount connectors.

2. Description of the Prior Art

Numerous electrical contact designs have been proposed for mounting on printed circuit boards. Many of these are for pins or posts that are formed by stamping flat sheet stock. In many cases, the pins or posts are initially connected to each other by a carrier strip to allow automated mounting on a printed circuit board. The aforementioned pins or posts take on different shapes, including relatively flat shapes as shown in U.S. Pat. No. 5,073,132. Thin flat posts are shown in U.S. Pat. No. 3,864,014. Box-type male connectors are illustrated in U.S. Pat. No. 3,375,486. Relatively large cross section pins are also disclosed in U.S. Pat. Nos. 4,017,142 and 3,428,934.

In U.S. Pat. Nos. 4,395,087 and 3,663,931, substantially square, solid pins are utilized for the electrical contacts. In the '087 patent, the pins are mounted on a carrier strip while in the '931 patent a unitary pin is shown formed integrally with a socket contact, presumably formed out of stamped material. In U.S. Pat. No. 4,369,572, a substantially solid rectangular pin is shown welded to the carrier strip. However, none of the known designs disclose pin connectors formed from flat sheet stock adapted or suitable for surface mounting on a printed circuit board.

It is also known to provide single loose surface mount pin terminals each packaged in individual plastic pockets P carried by a plastic pocket carrier or tape T, as shown in FIG. 18 and disclosed in U.S. Pat. No. 5,451,174. However, the aforementioned approach has a number of problems and has not found wide acceptance in the industry. To begin with, the additional plastic pockets or envelopes P have increased the per unit costs of the surface mounted components. Additionally, because the surface mounted pins are contained within a normally oversized pocket or enclosure, the components have at least some degree of freedom of movement therein and this has made it difficult and impractical to precisely align the components at the pick-up stations of the automatic pick-and-place equipment with the vacuum nozzles used for this purpose, notwithstanding the sprocket or pilot holes H intended to accurately align the pins. Such machinery demands very accurate alignment of the parts during pick-up and even small misalignments from the required positions may cause damage to the parts and/or to the nozzles themselves.

In view of the foregoing, although significant advancements have been made in the design and use of pick and place equipment, such machinery has primarily been used to pick and place components that have a sufficiently large flat surface to provide a suction area for engagement by the nozzles. As such, such machinery has primarily been used to pick and place transistors, ICs, capacitors, and numerous other electrical components that provide the requisite surfaces. However, because electrical posts, test points, IDC's and other electrical receptacles have not always exhibited the requisite geometries suitable for pick and place equipment, it has not always been possible to automate the mounting of such components utilizing surface mount technology.

Until now, therefore, surface mount posts were packaged in header form utilizing a plastic body to hold a row of components and placed on the board by a pick-and-place robot. If there was a need for test points, tabs, IDCs or any other type of single terminal, the board and the manufacturing process had to be a combination of surface mount technology and through-hole technology, because those terminals were only available for through-hole technology.

A two piece electrical contact pin is disclosed in U.S. Pat. No. 1,915,185. However, by its construction, the pin opening or aperture at one end thereof is capped to prevent solder molten on a pad or land of a printed circuit board from entering into the pin, were an effort made to surface mount the contact pin illustrated in the patent. Because the solder applied to the land would, upon melting, produce a fluid support the base of the pin would essentially "float" and move or shift on the pad or land. The only way that can be avoided is by providing capillary action so that the solder, once molten, is drawn away from the interface between the pin and the land and only a thin film of solder remains, as required, to secure the pin to the printed circuit board.

In U.S. Pat. No. 4,641,426, a surface mount connector system is illustrated which is compatible with surface mounting techniques because it can use reflow soldering instead of wave soldering. However, the plastic headers which are used require at least two holes which are shown as plated through holes. Therefore, the contacts that are disclosed are intended to be used with through the hole technology as opposed to surface mount technology. See also, in this connection, U.S. Pat. No. 4,884,335.

In U.S. Pat. No. 5,451,174, a number of surface mount contact connectors in the form of pins are disclosed which are generally similar to the ones disclosed in U.S. patent application Ser. No. 08/121,206, assigned to the assignee of the present invention. However, the capillary action which is provided with these connectors is somewhat limited because solder is only drawn up into the small spaces defined within the base itself. When excess solder is provided on the printed circuit board, however, the designs illustrated in this patent and in the assignee's co-pending application may not be sufficient to draw sufficient solder away from the land and this may result in the contact "floating" on the surface of the printed circuit board with attendant movements away from predetermined or desired locations on the board.

SUMMARY OF THE INVENTION

Accordingly, it is an object of the present invention to provide a pin connector which is suitable for surface mounting on printed circuit boards which does not have the disadvantages inherent in prior such pins.

It is another object of the present invention to provide a surface mount contact pin which is simple in construction and economical to manufacture.

It is still another object of the present invention to provide a surface mount contact pin which is capable of drawing away from the printed circuit board pad or land excess solder to assure stability of the pin on the board and stable positioning during re-flow or soldering of the pin to the board.

It is a further object of the present invention to provide a surface mount contact pins of the type aforementioned which can be formed of single or integral tubular pins or formed of two parts which are press-fitted together.

It is still a further object of the present invention to provide a surface mount contact pins of the type suggested above which can be formed with lateral or annular beads or shoulders above the bases at which the pins are mounted to provide stops suitable for closing vacuum nozzles used with pick-and-place machinery.

A yet further object of the present invention is providing a surface mount pin design which can be easily and inexpensively provided with two different surface finishes, such as, gold plating for the contact portions and tin plating for the mounting portions that need to be soldered to the printed circuit board.

A surface mount connector for printed circuit board (PCB) comprises an elongate pin defining an axis and having opposing ends. One end is dimentioned and configurated to be engageable with the mating connector. The other end is provided with a base having at least a portion arranged in a plane substantially normal to said axis and dimentioned to be positioned on a land or pad on a PCB. At least one solder-receiving reservoir means is provided extending from said base in the direction of said one end of said pin, said reservoir means being dimentioned to promote capillary action of molten solder on a pad or land and contact with said base. In this manner, excess solder is removed from the land or pad and into said reservoir means.

According to one presently preferred embodiment, a surface mount pin includes a longitudinal shank having a first end dimentioned and configurated to be received within a mating connector. Such shank has a second opposing end which is provided with base means suitable for mounting on a land or pad on the printed circuit board. An elongate channel extends between said first and second ends dimentioned to promote the passage of excess molten solder from said base into said channel by capillary action. According to another presently preferred embodiment, a two channel surface mount connector comprises an elongate pin defining an axis and having a first end dimentioned and configurated to be engageable with a mating connector and a normally captured second end. A sleeve defines a cylindrical space for receiving such second end of said pin in press-fit relationship. Said sleeve has an internal space having a general uniform cross section different from the cross section of said pin at said second end to create a plurality of elongate solder receiving channels generally parallel to said axis. Said pin only extends through one axial end of said sleeve, the other axial end of said sleeve being flared radially outwardly to form the base for supporting said pin on the printed circuit board. Said soldering receiving channels extend to said base to permit molten solder on the printed circuit to be drawn up into said solder-receiving channels by capillary action.

BRIEF DESCRIPTION OF THE DRAWINGS

This and other objects and features of the present invention will become clear from the following description taken in conjunction with preferred embodiments thereof with reference to accompanying drawings, in which:

FIG. 3 is an alternate embodiment of a surface mount pin in accordance with the present invention having a two piece construction;

FIG. 3A is a bottom plan view of the pin shown in FIG. 3;

FIG. 3B is an enlarged view of FIG. 3A to illustrate some of the details of the pin construction;

FIG. 3C is a top plan view of the pin illustrated in FIG. 3;

DESCRIPTION OF THE PREFERRED EMBODIMENTS

Figure 1:
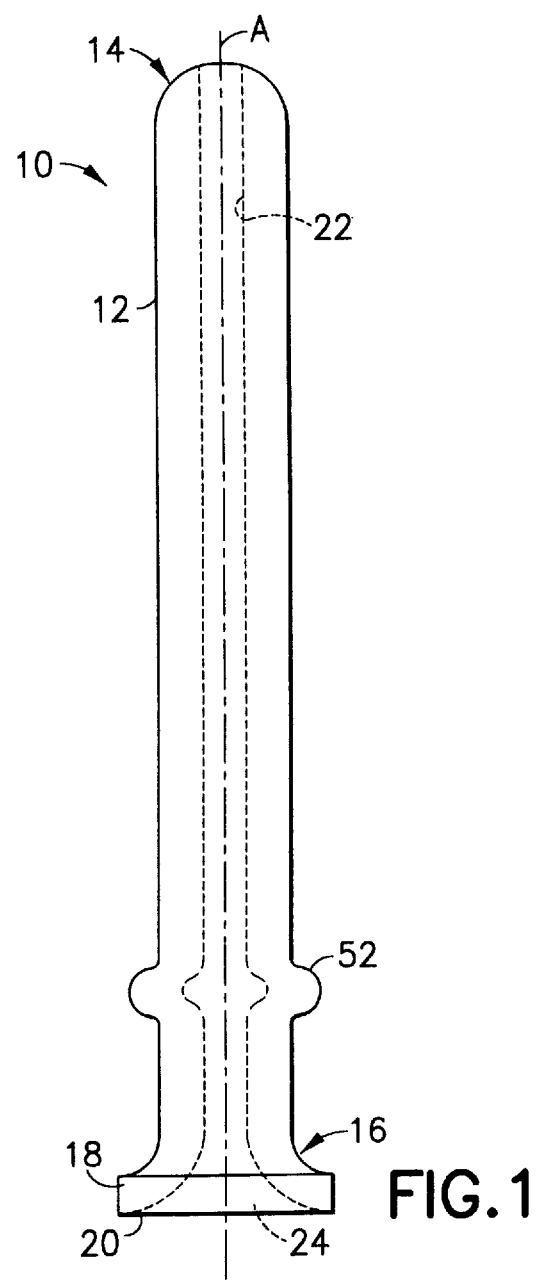
FIG. 1 is a side elevational view of a surface mount pin in accordance with the present invention, in which the pin is formed of a single tubular member.
Figure 2:
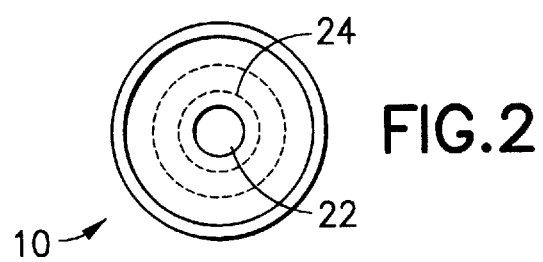
FIG. 2 is a bottom plan view of the pin shown in FIG. 1.

Referring now specifically to the drawings, in which the identical or similar parts are designated by the same reference numeral throughout, and first referring to FIGS. 1 and 2, a first embodiment of a surface mount connector pin for printed circuit boards is illustrated and generally designated by the reference numeral 10. The pin 10 includes a longitudinal tubular body 12 which defines an axis A. The body 12 has an upper free end 14, as viewed in FIG. 1, which is dimensioned and configurated to be engageable with a mating female connector (not shown). The other or lower end 16, as viewed in FIG. 1, is provided with a base 18 which is generally in the form of a radially outwardly flared or tapered flange which forms a surface 20 which is arranged in a plane substantially normal to the axis A for mounting on a land or pad (not shown) of a printed circuit board S, shown in phantom outline. The flare or taper can be produced by conventional techniques, such as by swaging. Automatic die swaging has been a conventional technique used in the art in the production of electronic, electrical and mechanical parts. Die swaging is described, for example, in a publication "Automatic Die Swaging Parts", published by Auto-swage Products, Inc. of Shelton, Conn.

An important feature of the present invention is the provision of an elongate channel 22 which extends between the upper and lower free ends 14, 16 respectively, which channel communicates with a space or cavity 24 formed within the swaged or flared base 18 which at least partially receives solder paste during placement of the pins on printed circuit boards during conventional surface mounting techniques. The elongate channel 22 is dimentioned to promote capillary action of molten solder on the pad or land in contact with the base 18, so that excess solder is removed from the land or pad and drawn into the elongate channel 22 which, for this purpose, serves as a reservoir or well which removes and stores excess solder. For example, the through hole or channel 22 may have a diameter on the order of 0.032 inches. With this arrangement, the capillary action is effective to remove excess solder during melting of the solder to avoid an excess solder accumulation on the land or pad on which the pin can float and undesirably shift positions. The capillary action assures that the pin continues to be solidly positioned on the land and the molten solder, which rises into the elongate channel 22, forms an integral member with the remaining film or layer at the interface between the land or pad of the printed circuit board and the base to enhance the rigidity and the security with which the pin is mounted on the printed circuit board.

The dimensions of the channel 22, or other channels to be described, that will provide capillary action will depend on numerous factors, including the nature of the solder paste, how clean and large the board and/or the contact surface area is, how level the board is, etc. Numerous technical papers have been written about the properties of solder that deal with the related topics of surface tension, wetting angles and capillary action. See, for example, "University Physics," Sears and Zemansky, 2nd Edition, Addison-Wesley Publishing Company, Inc., 1957, pages 231–234' "Testing SMDs for Solderability," B. M. Allen, "Surface Mount Technology" October 1988, pps. 17–18; "The Assessment of the Solderability of Surface Mounted Devices Using the Wetting Balance", Yoshida et al., International Tin Research Institute Report. Those skilled in the art can, knowing all the relevant factors, determine what those dimensions should be. The number channels, their dimensions, and/or their arrangement is not critical as long as they provide the desired capillary action.

Clearly, the less excess solder paste that is provided on the board, the less excess solder that will be produced during melting and the shorter the column of solder that will rise within the elongate channel 22. However, the elongate channel 22 is preferably sufficiently long so that it can draw into its interior a considerable amount of excess solder, if that is necessary, to avoid the aforementioned problems with conventional contacts or pins.

Referring to FIGS. 3–3C, an alternate embodiment of the surface mount pin in accordance with the invention is generally designated by the reference numeral 26. This pin 26 represents a two piece surface mount connector construction which includes an elongate solid pin 27 which also defines an axis A end which has a first end 28 dimentioned and configurated to be engageable with the remaining connector as with the pin 10. In this case, the end 28 is also shown to be provided with a tapered point 30, as is frequently conventional with solid pins.

The solid pin 27 is also provided with a normally captured, second end 32. The second end 32 is received within a sleeve or a rivet-like member 34 which defines a cylindrical space 36 for receiving the second end 32 of the pin in press-fit relationship. The sleeve 34 has an internal space 36 which is of a generally uniform cross section, best shown in FIG. 3B to be circular. Advantageously, the cross section of the sleeve is different from the cross section of the solid pin 28 which, in the embodiment being described, is square. As best shown in FIG. 3B, such an arrangement creates a plurality of elongate solder receiving channels 38 which are generally parallel to the axis A when the longitudinal edges 40 of the pin are press-fitted against the internal surface 36 of the sleeve 34. The pin 27 extends through only one axial end of the sleeve 34a. The other axial end 34b of the sleeve is flared radially outwardly to form the base 18 for supporting the pin on a printed circuit board. The solder receiving channels 38 extend to the base 18 to permit molten solder on the printed circuit board to be drawn up into the solder receiving channels 38 by capillary action.

In the two piece construction, as shown in FIG. 3, when the sleeve 34 has a circular uniform cross section, the captured end 32 of the pin 27 preferably has a cross section generally of the shape of a regular polygon having diagonals D slightly greater than the diameter of the circular space to assure a press-fit relationship. Also, the sleeve itself can be somewhat tapered along its axial length to provide different degrees of press-fit along its length while facilitating initial inserting of the pin into the sleeve. The regular polygon-shaped pin second end 32 forms spaced longitudinal edges 40 substantially parallel to the axis, as aforementioned, and the elongate channels 38 being formed between adjacent longitudinal edges 40.

Figure 4:
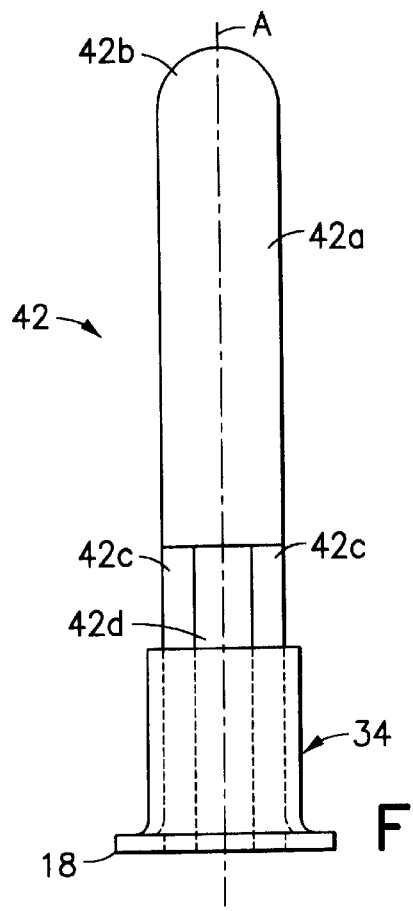
FIG. 4 is a side elevational view of another embodiment of a surface mount pin in accordance with the present invention which also has a two piece construction similar to the pin illustrated in FIG. 3.
Figure 4A:
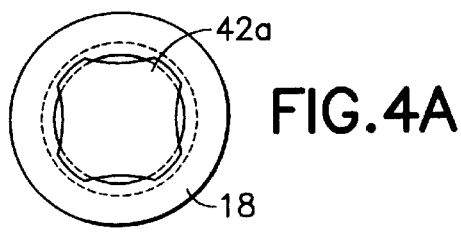
FIG. 4A is a bottom plan view of the pin shown in FIG. 4.
Figure 4B:
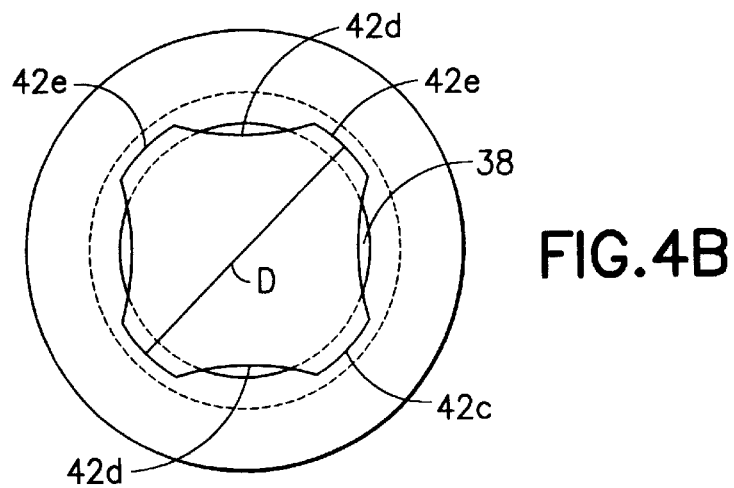
FIG. 4B is an enlarged view of FIG. 4A to show details of the construction of the pin shown in FIG. 4.

Referring to FIGS. 4–4B, a still further embodiment of the surface mount pin in accordance with the present invention is illustrated and generally identified by the reference numeral 42. Here, the upper or free end 42b of the pin 42a is solid and generally rounded, as shown, while the lower end 42c of the pin is stamped to provide a substantially uniform cross section generally in the shape of a regular polygon, and more specifically to approximate an octagon, wherein alternate surfaces 42d are generally concave, while the intermediate surfaces 42e are convex. The convex surfaces 42e frictionally engage the interior surface of the sleeve 34 to provide an interference or press-fit with the sleeve 34, while the concave surfaces 42e create the elongate channels 38 for receiving the molten solder by capillary action.

Figure 5:
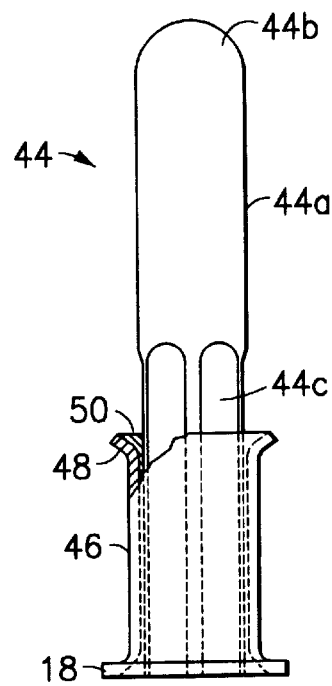
FIG. 5 is a still further embodiment of a surface mount in accordance with the present invention generally similar to the two piece construction shown in FIGS. 3 and 4, but having a different captured end cross section or profile and a modified sleeve.
Figure 5A:
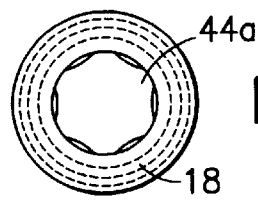
FIG. 5A is a bottom plan view of the pin as shown in FIG. 5.
Figure 5B:
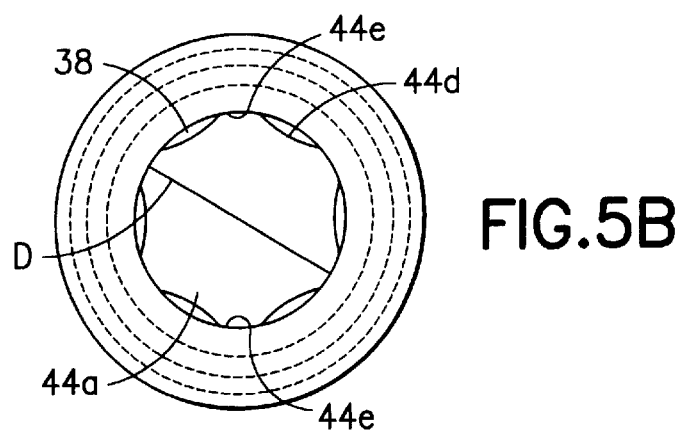
FIG. 5B is an enlarged of FIG. 5A to show details of construction of the pin shown in FIG. 5.
Figure 5C:
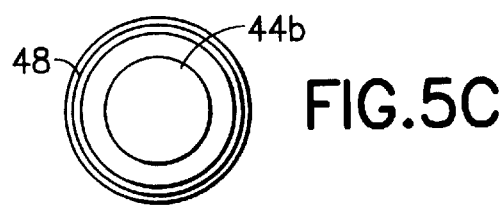
FIG. 5C is a top plan view of in as shown in FIG. 5.

In FIGS. 5–5C, still a further embodiment of the surface mount contact pin 44 is shown which is similar to the pin 42 shown in FIG. 4. However, while the upper end 44b of the pin 44a is solid and rounded as is the end 42b, the lower end 44c is coined or die-stamped to provide an end having uniform cross section in the general form of a hexagon. This construction provides diametrically opposing edges 44e which define a diagonal D which is slightly greater than the diameter of the internal cylindrical space of the sleeve 46 to provide the requisite press-fit relationship. With a uniform cross section in the form of a polygon for the lower end 44c of the pin, six elongate or longitudinal solder receiving channels 38 are created which are parallel to the axis A.

While the solid pin 10 shown in FIG. 1 has the benefit of having an extremely long elongate channel 22 which can receive a considerable amount of solder, it is clear that the two piece embodiments shown in FIGS. 3–5 have elongate channels which are significantly shorter because the channels extend only as high along the axis A as the height of the sleeves themselves, since the channels are formed between the adjoining surfaces of the pin faces or surfaces and the cylindrical surface of the sleeves. To some extent, the shorter solder receiving channels in the embodiments shown in FIGS. 3–5 are compensated by the fact that there are multiple such channels that can now be provided by suitably selecting the cross sectional configuration of the lower captured ends of the pins. The more sides in the polygon, the more although smaller the channels, as suggested. When the captured end of the pin defines a regular polygon inscribed within the circular cross section defined by the sleeve, the total area of the solder receiving channels can be represented by the following relationship:

$$A = \pi r^2 - 0.5\, nr^2 \sin(360°/n)$$

where r=internal radius of the sleeve and n=the number of sides in the regular polygon. Of course, the greater the number of sides n, the more channels but the smaller they become. This relationship can be used to maximize or select the effective area of all the solder-receiving channels consistent with the dimensions that will promote or maximize capillary action. The total effective area of all the channels can be modified, to some degree, by coining the surfaces of the captured pin end to be either slightly concave or convex—concave when the areas are to be increased and convex when they are to be decreased, as suggested in FIGS. 4B and 5B. However, should the spaced parallel channels formed in the embodiments shown in FIGS. 3–5 not be sufficient or adequate to receive excess solder, an upper lip can be formed on the sleeve. Referring to FIG. 5, the sleeve 46 is shown to be provided with an additional radially outwardly extending flange or upper lip 48 which produces a well or reservoir 50 at the upper end of the sleeve. The solder which is drawn from the base through all of the elongate solder receiving channels 38 feed the well or reservoir 50 and excess solder can be deposited in that well. The additional flange or lip 48 serves the additional purpose of providing a stop for a vacuum nozzle of a pick-and-place machine. This can also be achieved, in the single piece construction shown in FIG. 1, by providing a lateral bead or shoulder 52. The diameters of the lip or flange 48 and of the bead or shoulder 52 should be so as to cover the opening of the vacuum nozzle when engagement has been effected and the upper ends of the pins have been inserted into the vacuum nozzles. Such a construction allows the vacuum nozzle to pick up the pins without having to extend all the way down to the base of the pins, where excess solder may still be present on the PC board, since this may clog the nozzle. The lip or flange 48, therefore, serves a dual purpose and, therefore, the pin 44 forms a presently preferred embodiment of the present invention. The other constructions illustrated will, however, also provide many of the advantages and features of the present invention.

By using the sleeves of the two piece constructions, there is no need to provide a different die for each surface mount pin. Solid pins can be used while still providing the desired capillary action for the excess molten solder. Also, the solid pins can be gold plated while the sleeves can be tin plated to promote soldering to the PC boards while providing reliable gold plated contacts. Providing such two different finishes on an integral surface mount pin normally would entail expensive plating techniques such as selective masking.

Although the present invention has fully been described in connection with the preferred embodiments thereof with reference to the accompanying drawings, it is to be noted that various changes and modifications are apparent to those skilled in the art. Such changes and modifications are to be understood as included within the scope of the present invention as defined in the claims that follow.

We claim:

1. Surface mount connector for printed circuit boards comprising an elongate pin defining an axis and having opposing ends, one end being dimensioned and configured to be engageable with a mating connector, and the other end being provided at the extreme free end thereof with a base having at least a portion having an opening arranged in a plane substantially normal to said axis and dimensioned to be positioned on and soldered to a land or pad on a printed circuit board, at least one solder-receiving reservoir means extending from said base in the direction of said one end, said reservoir means being dimensioned to promote capillary action of molten solder on the pad or land in contact with said base, whereby excess solder is removed from the land or pad and into said reservoir means.

2. Surface mount connector as defined in claim 1, wherein said pin has an internal elongate channel extending between said opposing ends which serves as said reservoir means.

3. Surface mount connector as defined in claim 2, wherein said base is integrally formed with said elongate pin and is in the form of a radially outwardly extending taper or flared flange.

4. Surface mount connector as defined in claim 2, further provided with a radially outwardly projecting annular protuberance which serves as stop for a vacuum nozzle of a pick-an-place machine.

5. Surface mount connector as defined in claim 1, wherein the connector is formed of two parts, a first including a solid elongate pin and a second part formed of a hollow sleeve flared at one end to form said base, said other end of said pin being fixedly secured within said sleeve, the external surface of said pin other end and internal surface of said sleeve having different cross sectional profiles to provide a plurality of spaced lines of contact extending along said axis with intermediate elongate spaces which form said elongate channels.

6. Surface mount connector as defined in claim 5, wherein said one end of said pin has a round cross section.

7. Surface mount connector as defined in claim 5, wherein said pin is gold plated and said sleeve is tin plated.

8. Surface mount connector as defined in claim 5, wherein said sleeve has a circular internal cross section and said other end inserted within said sleeve has a cross section generally in the shape of a regular polygon, diagonally opposing vertices of said polygon being spaced from each other a distance slightly greater than the internal diameter of said sleeve to thereby provide a press fit between said pin and said sleeve.

9. Surface mount connector as defined in claim 8, wherein said polygon is essentially a square and four elongate channels are formed for receiving the solder.

10. Surface mount connector as defined in claim 8, wherein said polygon is essentially a hexagon and six elongate channels are formed for receiving the solder.

11. Surface mount connector as defined in claim 8, wherein said sides of said polygon are curved to provide concave surfaces on said other end.

12. A two piece surface mount connector comprising an elongate pin defining an axis and having a first end dimensioned and configured to be engageable with a mating connector and a normally captured second end; and a sleeve defining a cylindrical space for receiving said second end of said pin in press fit relationship, said sleeve having an internal space having a generally uniform cross section different from the cross section of said pin at said second end to create a plurality of elongate solder-receiving channels generally parallel to said axis, said pin only extending through one axial end of said sleeve, the other extreme free axial end of said sleeve being flared radially outwardly to form a base for supporting said pin on a printed circuit board, said solder receiving channels extending to said base to permit molten solder on the printed circuit board to be drawn up into said solder-receiving channels by capillary action.

13. A two piece surface mount connector as defined in claim 12, wherein said sleeve is provided at said one axial end with a radially outwardly extending flange to form an annular reservoir which can receive excess solder beyond that which can be received and stored in said elongate channels.

14. A two piece surface mount connector as defined in claim 12, wherein said uniform cross section of said sleeve is generally circular, and said second end of said pin has a cross section generally in the shape of a regular polygon having diagonals slightly greater than the diameter of said circular space to insure a press-fit relationship, said regular polygon-shaped second pin end forming spaced longitudinal edges substantially parallel to said axis, and said elongate channels being formed between adjacent longitudinal edges.

15. A two piece surface mount connector as defined in claim 14, wherein said polygon is a square and four longitudinal edges and four elongate channels are formed.

16. A two piece surface mount connector as defined in claim 14, wherein said polygon is a hexagon and six longitudinal edges and six elongate channels are formed.

17. A two piece surface mount connector as defined in claim 12, wherein said pin is gold plated and said sleeve is tin plated.

18. A surface mount pin including a longitudinal shank having a first end dimensioned and configured to be received within a mating connector, said shank having a second opposing end which is provided at the extreme free end thereof with base means suitable for mounting on a land or pad on a printed circuit board, an elongate channel extending between said first and second ends dimensioned to promote passage of excess molten solder from said base into said channel.

19. A surface mount pin as defined in claim 18, wherein said base means comprises a radially outwardly extending flange.

20. A surface mount pin as defined in claim 18, further comprising an annular radially outwardly extending projection on said pin at an intermediate point between said ends which serves as a stop for a vacuum nozzle of a pick-and-place machine.

* * * * *